US012712145B2

(12) United States Patent
Takahashi et al.

(10) Patent No.: US 12,712,145 B2
(45) Date of Patent: Aug. 18, 2026

(54) STAGE DEVICE, CHARGED PARTICLE BEAM APPARATUS, AND VACUUM APPARATUS

(71) Applicant: Hitachi High-Tech Corporation, Tokyo (JP)

(72) Inventors: Motohiro Takahashi, Tokyo (JP); Masaki Mizuochi, Tokyo (JP); Raifu Yamamoto, Tokyo (JP); Yasuhiro Ando, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 623 days.

(21) Appl. No.: 18/080,972

(22) Filed: Dec. 14, 2022

(65) Prior Publication Data

US 2023/0260740 A1 Aug. 17, 2023

(30) Foreign Application Priority Data

Jan. 17, 2022 (JP) ................................ 2022-004806

(51) Int. Cl.
*H01J 37/20* (2006.01)

(52) U.S. Cl.
CPC ......... *H01J 37/20* (2013.01); *H01J 2237/022* (2013.01); *H01J 2237/20221* (2013.01); *H01J 2237/20257* (2013.01)

(58) Field of Classification Search
CPC ........... H01J 2237/0213; H01J 2237/28; H01J 2237/20257; H01J 2237/022; H01J 2237/20221
See application file for complete search history.

(56) References Cited

U.S. PATENT DOCUMENTS 8,152,378 B2 * 4/2012 Tsai ...................... F16C 29/045 384/57
8,272,286 B2 9/2012 Aso et al.
10,770,259 B2 * 9/2020 Takahashi ................ B23Q 1/72
2015/0053857 A1 * 2/2015 Nishioka ................ H01J 37/20 250/311

(Continued)

FOREIGN PATENT DOCUMENTS

EP 1635374 A1 3/2006
JP H08-090385 A 4/1996
JP 2015-213399 A 11/2015

(Continued)

OTHER PUBLICATIONS

JP-2021118259-A machine translation, Oct. 18, 2025.*

(Continued)

*Primary Examiner* — Leda T Pham
(74) *Attorney, Agent, or Firm* — Foley & Lardner LLP

(57) ABSTRACT

A stage device is disposed in a vacuum environment and moves a target placed on the stage device, the stage device including: a guide rail that is laid on a base; a carriage that moves along the guide rail; rolling elements that come into contact with the guide rail and the carriage and rotate along with the movement of the carriage; a table that is connected to a part of the carriage and moves along with the carriage; and a blocking cover that is provided to cover a normal direction of a guide surface of the guide rail and blocks foreign matter scattered from the guide rail, the carriage, or the rolling elements.

13 Claims, 9 Drawing Sheets

(56) References Cited

U.S. PATENT DOCUMENTS

2015/0348744 A1 12/2015 Uchida et al.

FOREIGN PATENT DOCUMENTS

| | | | | |
|---|---|---|---|---|
| JP | 2015-230927 | A | | 12/2015 |
| JP | 2021118259 | A | * | 8/2021 |
| TW | 201129795 | A1 | | 9/2011 |
| TW | 201326609 | A1 | | 7/2013 |

OTHER PUBLICATIONS

Office Action with Search Report issued in corresponding Taiwanese Patent Application No. 111150598 dated Mar. 13, 2023 (7 pages).

Japanese Office Action issued in corresponding JP Patent Application No. 2022-004806, dated Jan. 21, 2025 with English translation (8 pages).

* cited by examiner

STAGE DEVICE, CHARGED PARTICLE BEAM APPARATUS, AND VACUUM APPARATUS

BACKGROUND OF THE INVENTION

1. Field of the Invention

The present disclosure relates to a stage device, a charged particle beam apparatus including the stage device, and a vacuum apparatus including the stage device.

2. Description of Related Art

In the related art, a technique regarding a stage for supporting a device stage for a semiconductor-related apparatus and a stage for accurately positioning and supporting a semiconductor wafer is known. In a range extending up to stages for apparatuses other than semiconductor-related apparatuses, JPH8-90385A describes a stage where a cover is provided to a guide portion or a ball screw portion such that a pipe is connected to the inside of the cover to suck scattered foreign matter from the guide portion or the ball screw portion. With this stage, attachment of foreign matter to an object to be processed or the guide portion in the air can be suppressed.

In processes such as manufacturing, measurement, or inspection of semiconductor wafers, a stage device is used to accurately positioning the semiconductor wafers. For the stage device used in the processes such as manufacturing, measurement, or inspection of the semiconductor wafers, not only position accuracy but also cleanliness where the amount of foreign matter is small is required. On the other hand, a guide having high rigidity is required to maintain the position accuracy, and a guide where a large number of rolling elements come into rolling contact is required to increase the rigidity of the guide. In addition, in order to increase the rigidity of the guide, it is necessary to increase a pre-load. Therefore, the number of contact positions and the wear amount increase, which causes problem of guide foreign matter scattered from the guide.

In a charged particle beam apparatus among semiconductor-related apparatuses, in order to prevent attenuation of charged particles by air molecules, it is necessary to dispose a sample and the stage device in a vacuum environment. Therefore, in the charged particle beam apparatus, the suction type described in JPH8-90385A cannot be used. In addition, in a vacuum environment, air molecules are not present, and thus the guide foreign matter is not decelerated. The scattering distance of the guide foreign matter increases as the moving speed of a table increases. The reason for this is that, as the speed at which the table operates increases, the kinetic energy of the guide foreign matter increases, and the potential energy to a reach height of the guide foreign matter increases.

Further, the guide is manufactured from a magnetic body such as bearing steel. In the charged particle beam apparatus or the like, a stray magnetic field from an electron optical system above a sample is present. Therefore, there is a problem in that the guide foreign matter as iron particles produced from a contact portion of the guide or the like is attracted and is attached to the sample. That is, the reach height of the guide foreign matter needs to be lower than a range of the stray magnetic field. When the moving speed of the table decreases to decrease the reach height of the guide foreign matter to be lower than the range of the stray magnetic field, the throughput decreases. That is, there is a trade-off relationship between the throughput and a decrease in the amount of foreign matter.

By replacing an element for conveying the table such as the ball screw described in JPH8-90385A with a linear motor, non-contact can be relatively easily implemented. However, in order to make a guide element such as a linear guide non-contact, a floating type configuration needs to be adopted, and sensors or actuators corresponding to six axes are required. Therefore, non-contact is not easily implemented.

SUMMARY OF THE INVENTION

The present disclosure provides: a stage device that can suppress attachment of guide foreign matter scattered from a contact type guide element to a target in a vacuum environment; and a charged particle beam apparatus and a vacuum apparatus that include the stage device.

A stage device according to the present disclosure is disposed in a vacuum environment and moves a target placed on the stage device, the stage device including: a guide rail that is laid on a base; a carriage that moves along the guide rail; rolling elements that come into contact with the guide rail and the carriage and rotate along with the movement of the carriage; a base table that is connected to a part of the carriage and moves along with the carriage; and a blocking portion that is provided to cover a normal direction of a guide surface of the guide rail and blocks foreign matter scattered from the guide rail, the carriage, or the rolling elements.

According to the present invention, attachment of guide foreign matter scattered from a contact type guide element to a target in a vacuum environment can be suppressed.

DESCRIPTION OF EMBODIMENTS

Embodiments of the present invention will be described in detail based on the drawings. In the following embodiments, it goes without saying that the components (including element steps and the like) are not necessarily required, unless expressly stated otherwise and unless they are considered to be clearly required in principle or other reasons.

Hereinafter, embodiments of a stage device, a charged particle beam apparatus, and a vacuum apparatus according to the present disclosure will be described with reference to the drawings.

First Embodiment

Figure 1:
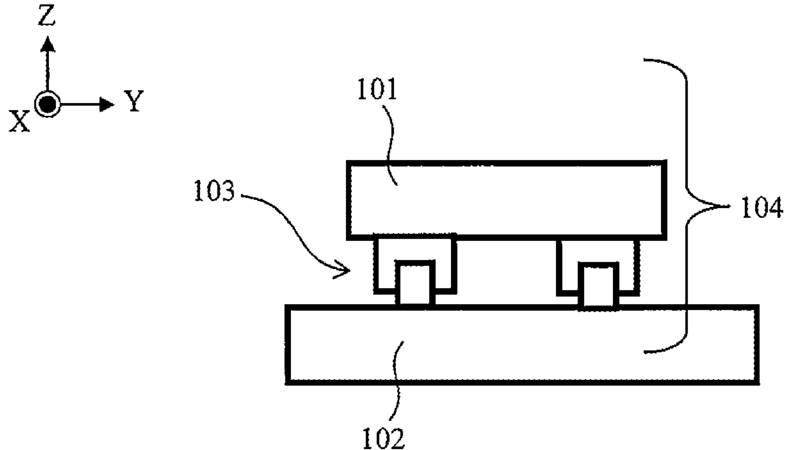
FIG. 1 is a diagram illustrating the summary of a stage device according to a first embodiment.

FIG. 1 is a diagram illustrating the summary of a stage device according to a first embodiment. A stage device 104 moves a target (for example, a semiconductor wafer) placed on the stage device 104 to a desired position. The stage device 104 is used in a vacuum environment of a charged particle beam apparatus or the like and in an environment where a magnetic field generation source is present above the stage device 104.

As illustrated in FIG. 1, the stage device 104 includes: a linear guide 103 that is provided in a base 102; and a table (base table) 101 that is mounted on the linear guide 103 and is movable in an X-axis direction. Although not illustrated in FIG. 1, a magnetic floating table that is movable in a Y-axis direction is present on the table 101.

Figure 2:
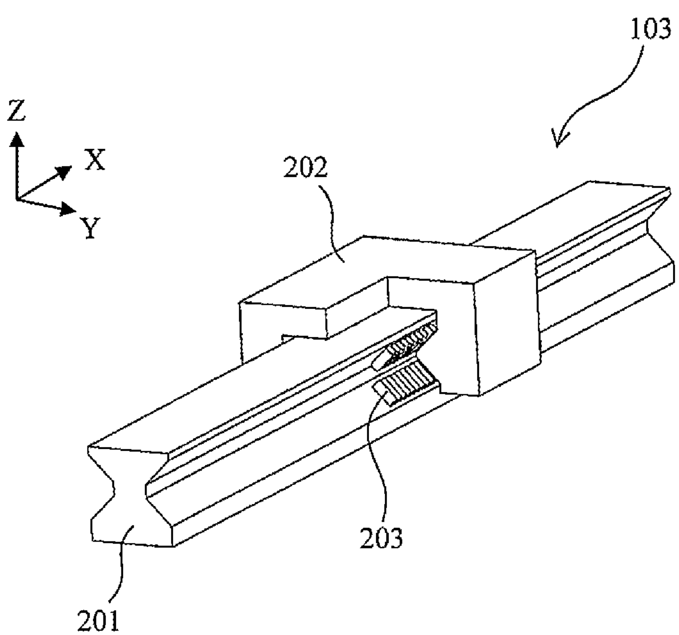
FIG. 2 is a diagram illustrating a detailed structure of a linear guide according to the first embodiment.

FIG. 2 is a diagram illustrating a detailed structure of the linear guide according to the first embodiment. In FIG. 2, a part of a carriage 202 is not illustrated to illustrate rolling elements 203. The linear guide 103 includes: a guide rail 201 that is laid on the base 102; the carriage 202 that moves along the guide rail 201; and a plurality of rolling elements 203 that come into contact with the guide rail 201 and the carriage 202 and rotate along with the movement of the carriage 202. The guide rail 201 extends in the X-axis direction, and the carriage 202 moves along the guide rail 201 in the X-axis direction. The rolling elements 203 have a cylindrical shape or a spherical shape and roll such that the carriage 202 smoothly slides on the rolling elements 203. The rolling elements 203 come into rolling contact with the guide rail 201 and the carriage 202, and wear occurs in contact surfaces between the guide rail 201 and the rolling elements 203 and in contact surfaces between the carriage 202 and the rolling elements 203. In addition, in the linear guide 103, in order to ensure rigidity, a pre-load is applied to compress the rolling elements 203. In order to apply the pre-load to the rolling elements 203, the dimensions of the guide rail 201 and the carriage 202 are adjusted. Due to this pre-load, the wear amount increases.

Due to the contact between the guide rail 201 and the rolling elements 203 and the contact between the carriage 202 and the rolling elements 203, a part of each of the components in the linear guide 103 may be peeled off and scattered. The matter peeled off from each of the components in the linear guide 103 will be referred to as guide foreign matter. The guide foreign matter is lifted and scattered by the rolling elements 203 that rotate along with the movement of the carriage 202. When the scattered guide foreign matter is attached to the target, the guide foreign matter is observed as foreign matter, which affects the observation result. In addition, each of the guide rail 201, the carriage 202, and the rolling elements 203 is manufactured from a magnetic material such as bearing steel, and thus has a characteristic of attracting the guide foreign matter due to a stray magnetic field by the magnetic field generation source present above the stage device 104.

Figure 3:
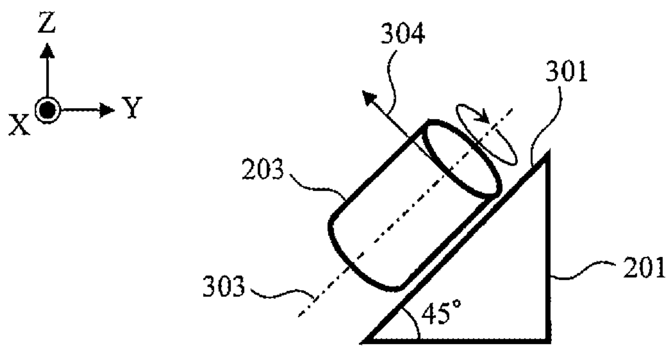
FIG. 3 is a diagram illustrating a configuration of a guide surface of a guide rail according to the first embodiment.

FIG. 3 is a diagram illustrating a configuration of a guide surface of the guide rail according to the first embodiment. FIG. 3 illustrates a guide surface 301 of which the normal direction faces upward. The guide surface 301 of the guide rail 201 according to the first embodiment has an inclination angle of 45° with respect to a horizontal plane. The rolling element 203 rotates around a straight line 303 parallel to the guide surface 301. The guide foreign matter produced from the guide surface 301 is involved with the rotation of the rolling elements 203 and is scattered in various directions depending on the peripheral speed. The scattering direction in which the guide foreign matter is involved with the rotation of the rolling elements 203 and is scattered upward matches with the normal direction 304 of the guide surface 301.

Figure 4:
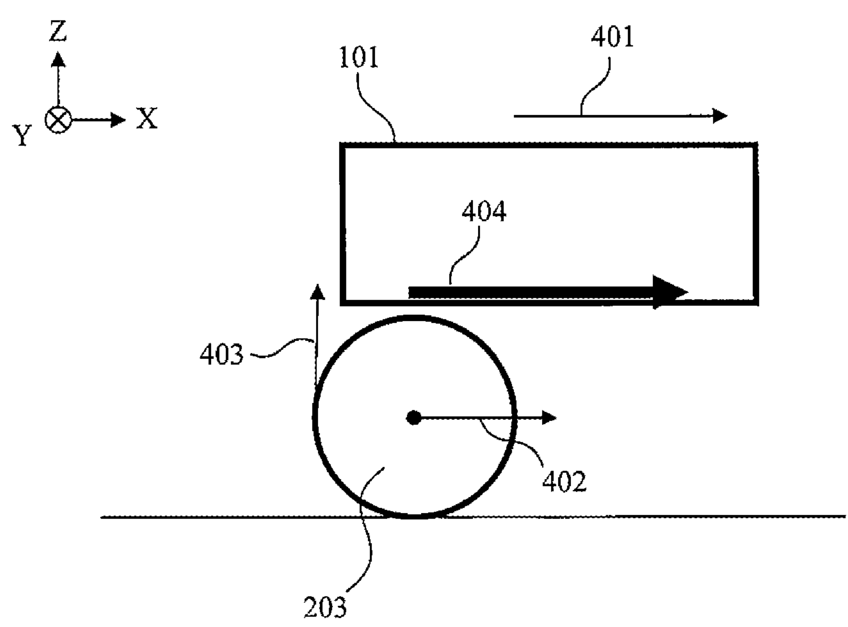
FIG. 4 is a diagram illustrating a relationship between a speed of a table according to the first embodiment and a peripheral speed of a rolling element.

FIG. 4 is a diagram illustrating a relationship between the speed of the table according to the first embodiment and the peripheral speed of the rolling element. When a speed 401 of the table 101 is represented by Vs, a moving speed 402 of the center of the rolling element 203 is half of the speed 401 of the table 101 and is represented by Vs/2. In addition, a peripheral speed 403 of the rolling element 203 matches with the moving speed of the center of the rolling element 203, and when a scattering speed 404 of the guide foreign matter on the guide surface on the carriage 202 side that moves at Vs is represented by Vo, the following Expression 4.1 is satisfied.

$$Vo = Vs/2 + Vs = Vs*3/2 \quad \text{(Expression 4.1)}$$

The kinetic energy Ev of the guide foreign matter is obtained from the following Expression 4.2.

$$Ev = 1/2*m*Vo\^{}2 \quad \text{(Expression 4.2)}$$

Here, m represents the mass of the guide foreign matter.

On the other hand, the potential energy Eh of the guide foreign matter is obtained from the following Expression 4.3.

$$Eh = m*g*h \quad \text{(Expression 4.3)}$$

Here, the distance from the guide surface 301 to the height position that the guide foreign matter reaches is represented by h, and the gravitational acceleration is represented by g.

A condition where the guide foreign matter does not reach the height h satisfies the following Expression 4.4.

$$Ev < Eh \quad \text{(Expression 4.4)}$$

By substituting Expression 4.2 and Expression 4.3 into Expression 4.4, the following Expression 4.5 is satisfied.

$$Vo < (2*g*h)^{\wedge}1/2 \quad \text{(Expression 4.5)}$$

Figure 5:
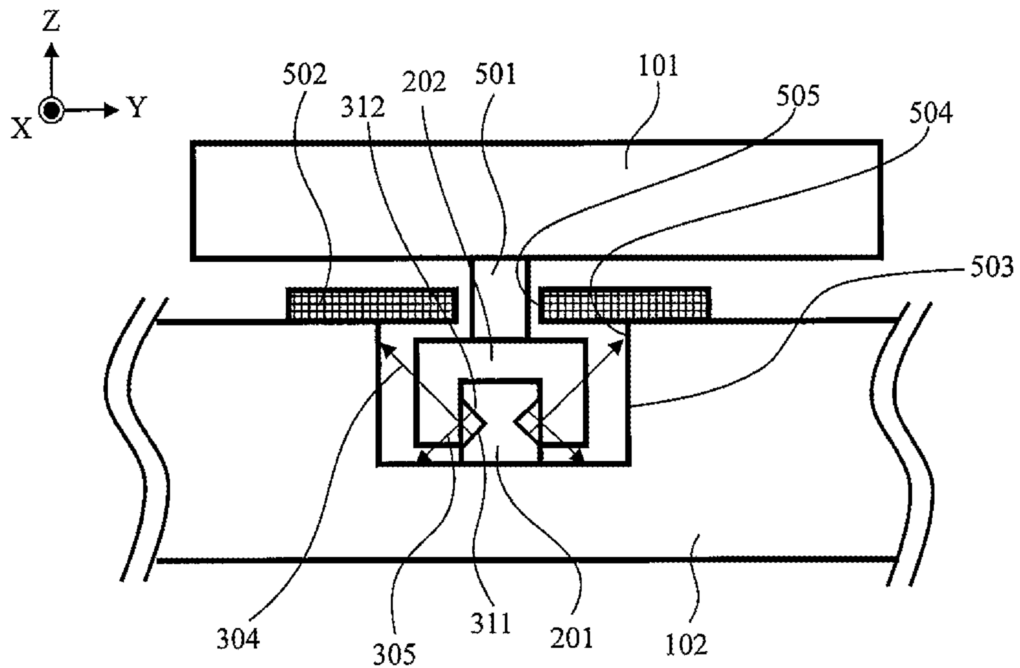
FIG. 5 is a diagram illustrating a configuration of a blocking cover according to the first embodiment.

FIG. 5 is a diagram illustrating a configuration of a blocking cover according to the first embodiment. In the base 102 such as a bottom surface of a sample chamber, a groove portion 503 of a dimension where the linear guide 103 can be accommodated is formed. The guide rail 201 is fixed to the groove portion 503. Further, a spacer 501 is provided in an upper portion of the carriage 202. The carriage 202 and the table 101 are connected to a part of the center of an upper surface of the carriage 202 through the spacer 501. The width of the spacer 501 is less than the width of the carriage 202.

A blocking cover 502 is provided to cover the normal direction 304 of a lower guide surface 311 of the guide rail 201, and blocks the guide foreign matter scattered from each of the units of the linear guide 103. The normal direction 304 of the lower guide surface 311 includes a vector component that faces upward. In the blocking cover 502 that is fixed to the base 102 to cover a part of an upper opening portion 504 of the groove portion 503, an opening portion 505 through which the spacer 501 passes is formed. The opening portion 505 is formed in the X-axis direction as in the guide rail 201, and the spacer 501 attached to the carriage 202 moves along the opening portion in the X-axis direction.

In addition, a bottom portion of the groove portion 503 is provided in a normal direction 305 of an upper guide surface 312 of the guide rail 201. That is, the groove portion 503 is provided to cover the normal direction 305 of the upper guide surface 312 of the guide rail 201, and blocks the guide foreign matter scattered from each of the units of the linear guide 103.

In the first embodiment, the blocking cover 502 is configured as a separate member from the base 102. The blocking cover 502 may be integrated with the base 102. In this case, due to restriction in component processing accuracy, the opening portion 505 needs to be provided widely in order to avoid contact with the carriage 202. In addition, in the embodiment, the spacer 501 is configured as a separate member from the carriage 202. The spacer 501 may be integrated with the carriage 202. In addition, in the first embodiment, the spacer 501 is configured as a separate member from the table 101. The spacer 501 may be integrated with the table 101.

Figure 6:
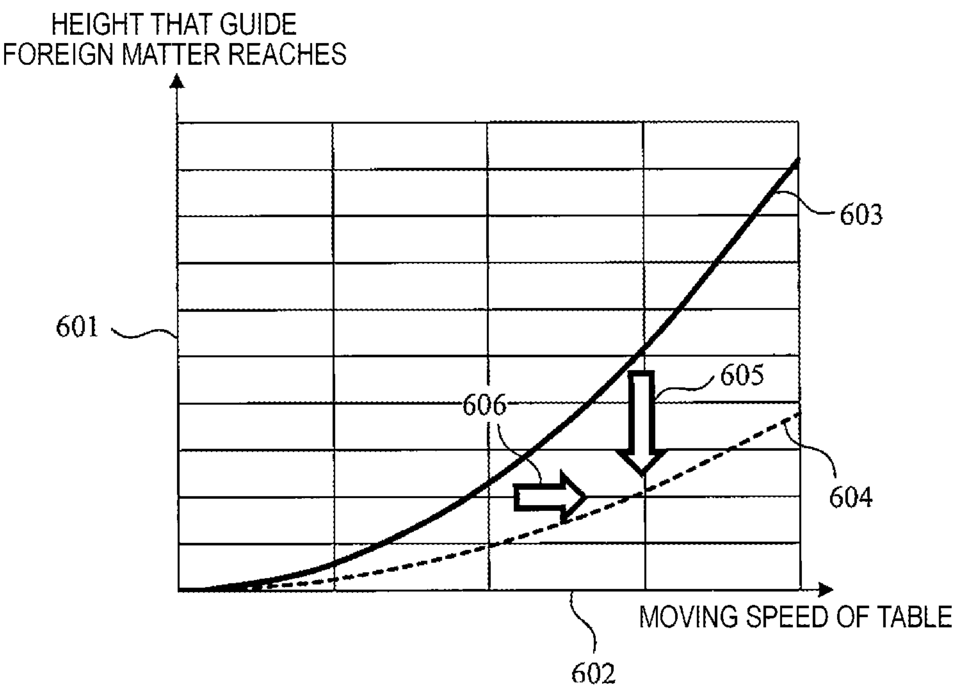
FIG. 6 is a diagram illustrating a relationship between a moving speed of the table according to the first embodiment and a height that guide foreign matter reaches.

FIG. 6 is a diagram illustrating a relationship between the moving speed of the table according to the first embodiment and the height that the guide foreign matter reaches. The effects of the blocking cover according to the first embodiment will be described with reference to FIG. 6.

When the guide foreign matter repels in a space formed by the groove portion 503 and the blocking cover 502, a speed v of the repulsive guide foreign matter is obtained from the following Expression 6.1.

$$v = Vo*e^{\wedge}N \quad \text{(Expression 6.1)}$$

e represents a coefficient of repulsion, and N represents the number of times of repulsion.

When the relationship between the potential energy and the kinetic energy is applied to the repulsive guide foreign matter as in Expression 4.5 described above, the following Expression 6.2 is satisfied.

$$v = Vo*e^{\wedge}N < (2*g*h)^{\wedge}1/2 \quad \text{(Expression 6.2)}$$

When Expression 6.2 is solved for the number of times of repulsion N, the following Expression 6.3 is satisfied.

$$N > \log(e)(Vo/(2*g*h)^{\wedge}1/2) \quad \text{(Expression 6.3)}$$

In FIG. 6, the vertical axis represents the height 601 that the guide foreign matter reaches, and the horizontal axis represents the moving speed 602 of the table 101. In FIG. 6, assuming that the coefficient of repulsion e is 0.8, the height that the guide foreign matter reaches with respect to the moving speed of the table 101 is plotted based on the relational expressions for a case 603 (solid line) where the blocking cover 502 is not provided and a case 604 (dotted line) where the blocking cover 502 is provided.

At the same moving speed of the table 101, the reach height of the guide foreign matter is reduced to half 605 by providing the blocking cover 502. In addition, when the height that the guide foreign matter reaches is a restriction condition, the moving speed of the table 101 can be improved 606, which also contributes to the improvement of the throughput.

Figure 7:
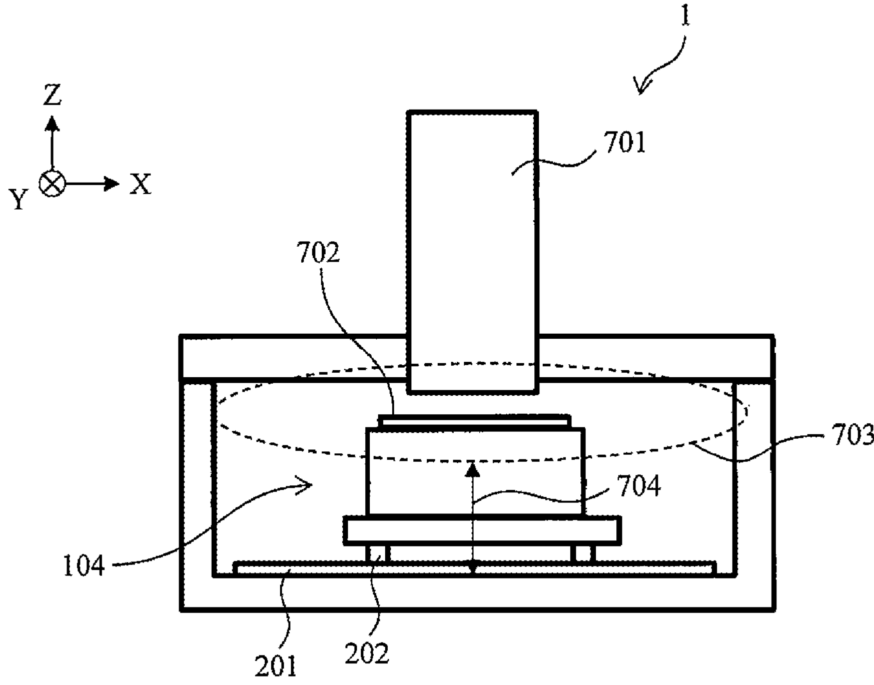
FIG. 7 is a diagram illustrating a state where the stage device according to the first embodiment is provided in a magnetic field environment.

FIG. 7 is a diagram illustrating a state where the stage device according to the first embodiment is provided in a magnetic field environment. An apparatus illustrated in FIG. 7 is a charged particle beam apparatus, and the stage device 104 is provided in a magnetic field environment that is generated in the charged particle beam apparatus. The stage device 104 holds and moves a sample 702 such as a semiconductor wafer. Above the sample 702, a stray magnetic field is generated by an electron optical system 701. Due to the influence of the stray magnetic field, the guide foreign matter is attracted in the upward direction. When the magnetic attraction force applied to the guide foreign matter is higher than the gravity applied to the guide foreign matter, the guide foreign matter is attracted by the stray magnetic field by the electron optical system 701. Due to the vibration of the charged particle beam apparatus 1 or a change in the magnetic field state of the electron optical system 701, the guide foreign matter may fall to an upper surface of the sample 702.

Depending on the electron optical system 701, a range 703 where the magnetic field higher than the gravity is generated may include the upper surface of the sample 702. In this case, a height distance 704 from the guide surface to the range 703 where the magnetic field is generated needs to be a limit value of the height that the guide foreign matter reaches.

Figure 8:
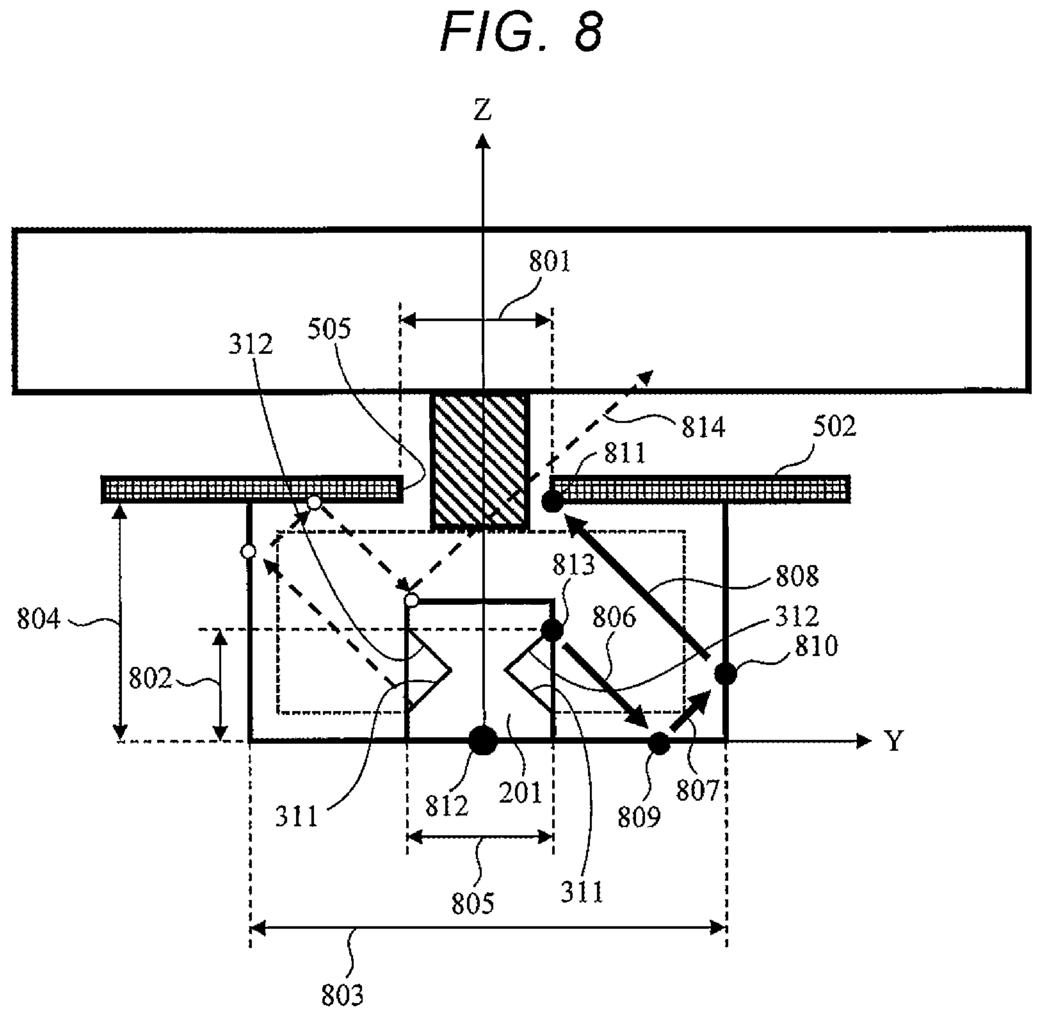
FIG. 8 is a diagram illustrating a dimension of an opening portion of the blocking cover according to the first embodiment.

FIG. 8 is a diagram illustrating a dimension of an opening portion of the blocking cover according to the first embodiment. The dimension of the blocking cover 502 effective for blocking the guide foreign matter will be described with reference to FIG. 8.

An opening dimension 801 of the opening portion 505 of the blocking cover 502 is represented by Lc, a height 802 of the upper guide surface 312 is represented by Hr, a width 803 of the groove portion 503 is represented by Ld, a depth

804 of the groove portion 503 is represented by Hd, and a width 805 of the guide rail 201 is represented by Lr. The origin is set to the center 812 of a bottom surface of the guide rail 201.

The guide foreign matter scattered from the lower guide surface 311 of the guide rail 201 repels at least three times in an inner wall surface of the groove portion 503, a bottom surface of the blocking cover 502, and an upper surface of the guide rail 201 as in a trajectory 814 indicated by a dotted line. Among the three times of repulsion, the number of times of repulsion affecting the height that the guide foreign matter reaches is two times in the bottom surface of the blocking cover 502 and the upper surface of the guide rail 201 as the upper and lower surfaces in the space.

On the other hand, the guide foreign matter scattered from the upper guide surface 312 of the guide rail 201 is indicated by trajectories 806, 807, and 808 indicated by a solid line. Depending on the opening dimension 801 of the blocking cover 502, the guide foreign matter repels in the bottom surface of the groove portion 503 and the inner wall surface of the groove portion 503, and flies upward from the opening portion without repelling by the blocking cover 502. That is, the number of times of repulsion affecting the height that the guide foreign matter reaches is only once in the bottom surface of the groove portion 503 as the upper and lower surfaces in the space.

A trajectory of guide foreign matter scattered from an end point 813 of the upper guide surface 312 of the guide rail 201 that is most difficult to block is considered. Coordinates (Y0, Z0) of the end point 813 where the guide foreign matter is scattered satisfy the following Expression 8.1.

$$(Y0, Z) = (Lr/2, Hr) \quad \text{(Expression 8.1)}$$

Initially, according to the trajectory 806 of the guide foreign matter, the bottom surface of the groove portion 503 is a first repulsion point 809 of the guide foreign matter. Coordinates (Y1, Z1) of the first repulsion point 809 satisfy the following Expression 8.2 because the guide foreign matter is scattered at 45°.

$$(Y1, Z1) = (Lr/2 + Hr, 0) \quad \text{(Expression 8.2)}$$

Next, according to the trajectory 807 of the guide foreign matter after the first repulsion, the inner wall surface of the groove portion 503 is a second repulsion point 810 of the guide foreign matter. Coordinates (Y2, Z2) of the second repulsion point 810 can also be calculated from a reflection angle of 45° and satisfy the following Expression 8.3.

$$(Y2, Z2) = (Ld/2, Ld/2 - (Lr/2 + Hr)) \quad \text{(Expression 8.3)}$$

Further, assuming that the trajectory 808 of the guide foreign matter after the second repulsion repels in the bottom surface of the blocking cover 502, coordinates (Y3, Z3) of a third repulsion point 811 satisfy the following Expression 8.4.

$$(Y3, Z3) = (Ld/2 - (Hd - Z2), HD) \quad \text{(Expression 8.4)}$$

As a result, when the following Expression 8.5 is satisfied with respect to the opening dimension of the blocking cover 502, the trajectory 808 repels in the bottom surface of the blocking cover 502, and the guide foreign matter scattered from the guide surface repels at least two times in the upper and lower surface of the space.

$$Lc > Hd - Z2 \quad \text{(Expression 8.5)}$$

By substituting Expression 8.3 into Expression 8.5, the following Expression 8.6 is satisfied.

$$Lc > Hd - Ld/2 + Hr + Lr/2 \quad \text{(Expression 8.6)}$$

That is, when the dimension of the opening portion 505 of the blocking cover 502 is designed such that Expression 8.6 is satisfied, the guide foreign matter can be repelled from the blocking cover 502, and the height that the guide foreign matter reaches can be reduced.

Figure 9:
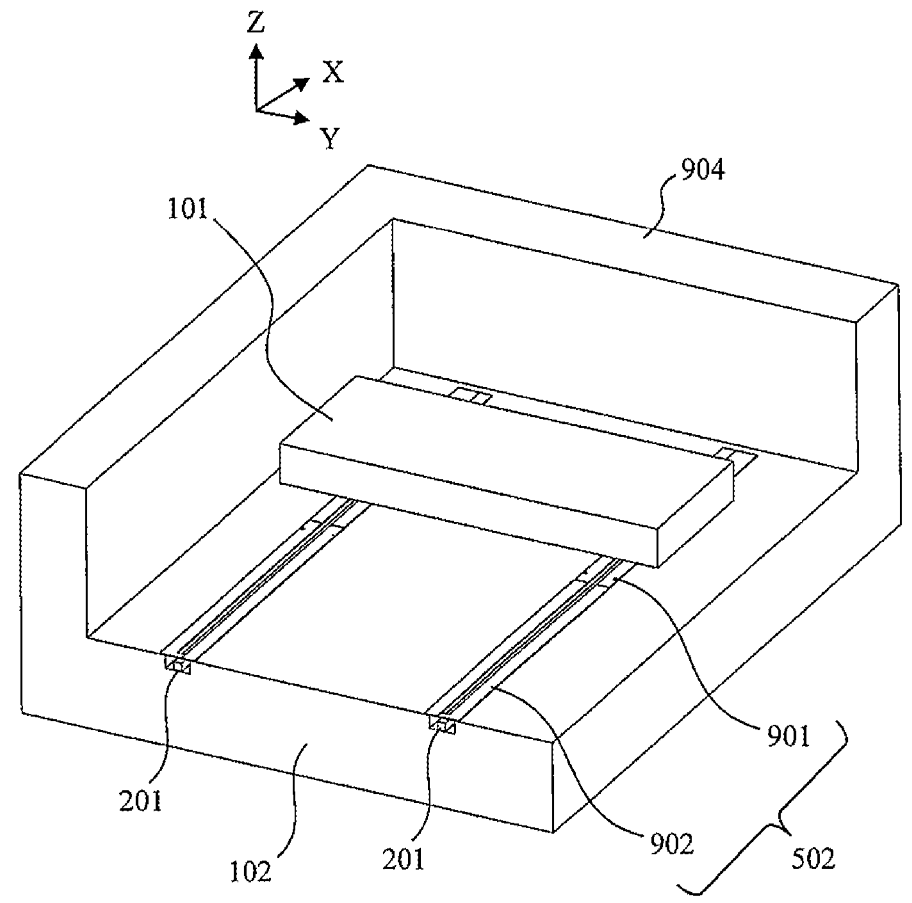
FIG. 9 is a perspective view illustrating the blocking cover according to the first embodiment.

FIG. 9 is a perspective view illustrating the blocking cover according to the first embodiment. As illustrated in FIG. 9, the blocking cover 502 is divided into a depth side cover (first blocking member) 901 and a front side cover (second blocking member) 902. The depth side cover 901 and the front side cover 902 are detachable from a base 102 of a sample chamber 904. For maintenance such as regular greasing of the linear guide 103, the blocking cover 502 is assumed to be detached. As illustrated in FIG. 9, by moving the table 101 to the depth side (first position), the front side cover 902 is easily detachable. In addition, by moving the table 101 to the front side (second position), the depth side cover 901 is easily detachable.

In the embodiment, the blocking cover 502 is divided into the two parts. However, depending on characteristics of the maintenance, the blocking cover 502 may be divided into three or more parts. In addition, the blocking cover 502 may be fixed to the base 102 of the sample chamber 904 through a flat head screw. As a result, the position of the blocking cover 502 relative to the sample chamber 904 is determined. Therefore, position adjustment for avoiding the contact between the spacer 501 and the blocking cover 502 is unnecessary, and a period of time required for the maintenance can be reduced.

Figure 10:
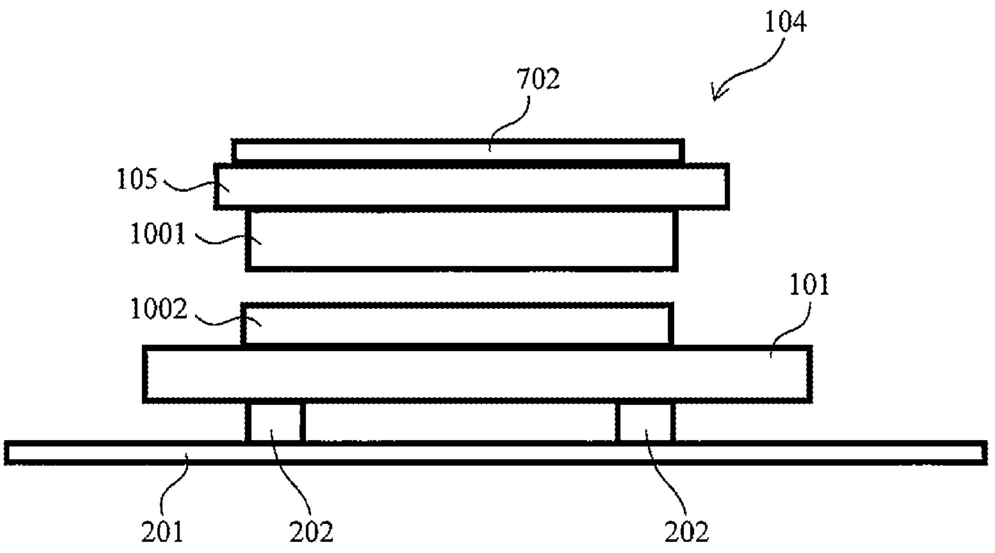
FIG. 10 is a diagram illustrating a stage device including a floating type upper table according to the first embodiment.

FIG. 10 is a diagram illustrating a stage device including a floating type upper table according to the first embodiment. As illustrated in FIG. 10, the stage device 104 according to the first embodiment is a stack type stage device including: a lower table 101 that moves using the contact type linear guide 103; and a non-contact floating type upper table (floating table) 105. The stage device 104 according to the first embodiment is movable in directions of two axes (the X-axis and the Y-axis) but may be movable only in one axis direction.

A floating guide mover 1001 is mounted on the upper table 105, and a floating guide stator 1002 is mounted on the lower table 101. In the upper table 105, the influence of the stray magnetic field of the electron optical system 701 is large, and thus the restriction of the occurrence of the guide foreign matter is more severe than that of the lower table 101. Therefore, even if the cost increases, non-contact is required, and a non-contact floating type is adopted in the first embodiment. As a method for achieving non-contact of the guide element of the table in a vacuum environment, an air static pressure guide with a differential exhaust mechanism or a magnetic floating guide can be used. The magnetic floating guide can deal with a high vacuum.

On the other hand, in the lower table 101 of the stack type stage device 104, the influence of the stray magnetic field of the electron optical system is small. Therefore, the contact type is used as the guide element, and the blocking cover 502 of the guide foreign matter is adopted.

Effect of First Embodiment

The blocking cover 502 is provided to cover the normal direction 304 of the lower guide surface 311 as the scattering direction of the guide foreign matter. As a result, the guide foreign matter scattered from the linear guide 103 can be suppressed from being scattered upward from the space formed by the blocking cover 502 and the groove portion 503.

In addition, the groove portion 503 provided in the base 102 accommodates the linear guide 103. As a result, the guide foreign matter can be repelled in the inner wall portion of the bottom portion of the groove portion 503. In addition, the blocking cover 502 is provided to cover the upper opening portion 504 of the groove portion 503. As a result, the guide foreign matter can be repelled in the blocking cover 502. Thus, the reach height of the guide foreign matter can be reduced.

Parts of the table 101 and the carriage 202 are connected through the spacer 501, and the opening portion 505 through which the spacer 501 passes is formed in the blocking cover 502. As a result, most of the upper portion of the linear guide 103 can be covered with the blocking cover 502.

The opening dimension 801 of the opening portion 505 is determined based on the height 804 of the space formed by the blocking cover 502 and the groove portion 503, the width 803 of the space, the height 802 of the guide surface, and the width 805 of the guide rail 201. As a result, the blocking cover 502 having a dimension suitable for suppressing the guide foreign matter from flying from the opening portion 505 can be obtained.

The blocking cover 502 is divided into the depth side cover 901 and the front side cover 902, and the depth side cover 901 and the front side cover 902 are detachable from the base 102. As a result, maintenance such as greasing of the linear guide 103 is simple.

The influence of the stray magnetic field of the electron optical system 701 is large, and the upper table 105 where the restriction of the occurrence of the guide foreign matter is more severe than that of the lower table 101 is a floating type. As a result, the occurrence of the guide foreign matter from the upper table 105 can be prevented.

In addition, the structure of the blocking cover 502 according to the first embodiment is simple. Therefore, various stage devices can be adopted at a low cost. In addition, a decrease in rigidity can be minimized. Further, the blocking cover 502 can be manufactured from a plate material and has a simple shape. Therefore, the component accuracy can be easily achieved, a gap with the carriage 202 can be reduced accordingly, and the foreign matter blocking effect can be improved. In the cover structure such as JPH8-90385A, the mover side has a complicated shape, the size of the apparatus increases, the rigidity decreases, and the vibration is generated. Therefore, there is also a problem in that the apparatus cannot be driven at high speed. However, in the first embodiment, the blocking cover 502 is attached to the non-operation side and also has a simple shape. Therefore, the problem does not occur.

In addition, in order to prevent the occurrence of the guide foreign matter during the movement in the X and Y directions, a method of using a plane floating stage as the stage can also be used. However, the stray magnetic field from the stage is high, a coil array or a magnet array needs to be formed to implement the plane floating stage, and the cost also significantly increases. On the other hand, with the stack type configuration in which the floating guide is applied to the upper axis and the blocking cover 502 is applied to the lower axis as in the first embodiment, a stage having no foreign matter in the X and Y axes can be implemented at a low cost. Under the influence of a magnetic field and in a vacuum environment, for example, in a charged particle beam apparatus, a sufficient countermeasure having high cost effectiveness can be taken against foreign matter.

On the other hand, in the lower table 101 of the stack type stage device 104, the influence of the stray magnetic field of the electron optical system is small. Therefore, in the first embodiment, the contact type is used as the guide element, and the blocking cover 502 of the guide foreign matter is adopted. As a result, the countermeasure can be taken against the guide foreign matter at a low cost. In particular, in the stack type stage device 104, the movable mass of the lower axis increases. Therefore, a positioning instruction may be configured such that the upper axis operates at a high speed and a high frequency and the lower axis operates at a low speed and a low frequency.

Second Embodiment

Figure 11:
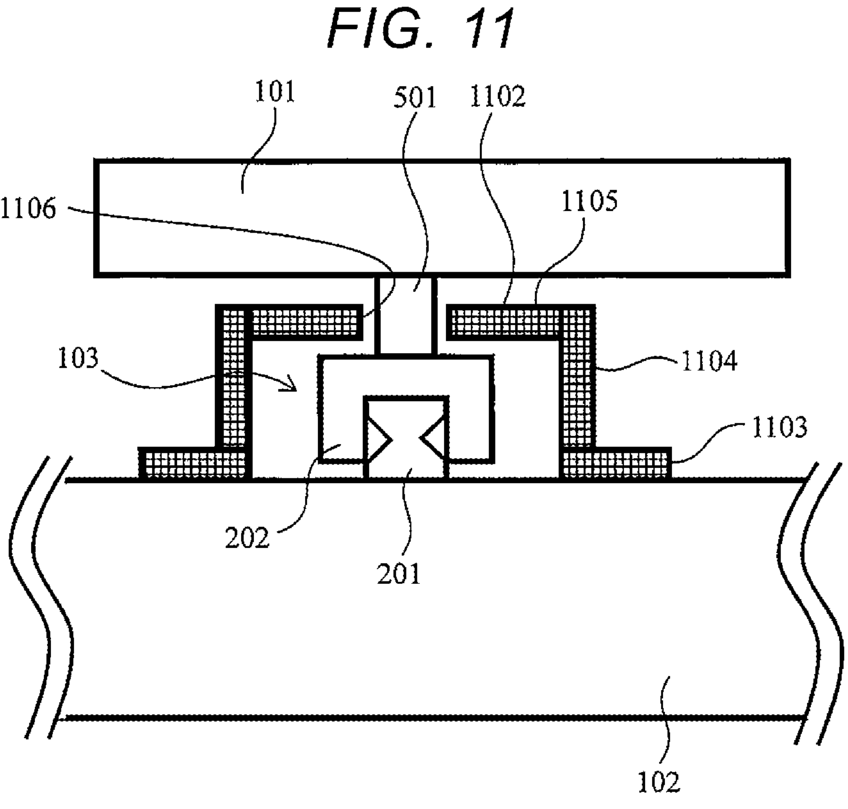
FIG. 11 is a diagram illustrating a configuration of a blocking cover according to a second embodiment.
Figure 12:
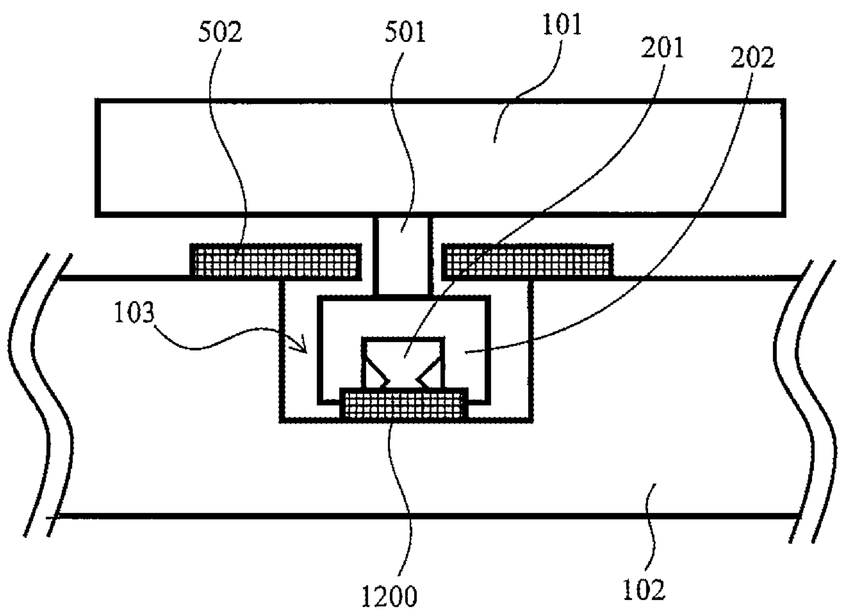
FIG. 12 is a diagram illustrating a magnet that magnetizes a guide rail according to a fourth embodiment.

FIG. 11 is a diagram illustrating a configuration of a blocking cover according to a second embodiment. In the first embodiment, the groove portion 503 is formed in the base 102, the groove portion 503 accommodates the linear guide 103, and the blocking cover 502 is attached to cover the upper opening portion 504 of the groove portion 503. In the second embodiment, as illustrated in FIG. 11, a blocking cover 1102 is attached to cover lateral sides and an upper side of the guide rail 201 and the carriage 202 laid on the base 102 without providing the groove portion that accommodates the linear guide 103 in the base 102.

The blocking cover 1102 according to the second embodiment includes: a portion 1103 for fixing the blocking cover 1102 to the base 102; a wall portion 1104 that covers the lateral side of the linear guide 103; and a top surface portion 1105 that covers the upper side of the linear guide 103. An opening portion 1106 is provided in the top surface portion 1105 of the blocking cover 1102, and the spacer 501 passes through the opening portion 1106. The other configurations are the same as those of the first embodiment.

Effect of Second Embodiment

In the second embodiment, the groove portion does not need to be formed in the base 102. Therefore, the blocking cover 1102 can be provided at various positions.

In addition, the blocking cover 1102 is a separate member from the base 102. Therefore, the performance of the maintenance such as greasing of the linear guide 103 can be improved. The other effects are the same as the above-described embodiment.

Third Embodiment

In the first and second embodiments, the material of the blocking cover is not described. A blocking cover according to a third embodiment is formed of a magnetic material. The other configurations are the same as those of the first embodiment or the second embodiment.

Effect of Third Embodiment

In the third embodiment, when the guide foreign matter of the magnetic body generated from the linear guide 103 comes into contact with or flies near the blocking cover, the blocking cover itself attracts the guide foreign matter such that the guide foreign matter can be suppressed from being scattered above the table 101. The other effects are the same as the above-described embodiments.

Embodiment 4

In the third embodiment, the blocking cover is formed of the magnetic material. In a fourth embodiment, the linear guide 103 is formed of a magnetic material, and a magnet 1200 is disposed near the linear guide 103. The magnet 1200 magnetizes the guide rail 201 formed of a magnetic material. The other configurations are the same as those of the first embodiment.

Effect of Fourth Embodiment

In the fourth embodiment, a magnetic attraction force acts on the guide foreign matter that flies from the linear guide 103. Therefore, the initial speed of the guide foreign matter can be reduced, and the reach height of the guide foreign matter can be reduced. In the fourth embodiment, in order to avoid the influence of the stray magnetic field from the magnet 1200 on the trajectory of a charged particle beam, it is effective to use the blocking cover 502 as a magnetic body for blocking the stray magnetic field from the magnet 1200. The other effects are the same as the above-described embodiments.

Fifth Embodiment

A stage device according to a fifth embodiment is disposed in a vacuum environment. In the space formed by the blocking cover 502 of the stage device according to the fifth embodiment, an exhaust port 1300 that is connected to an exhaust path of a vacuum pump for implementing a vacuum environment is provided.

Figure 13:
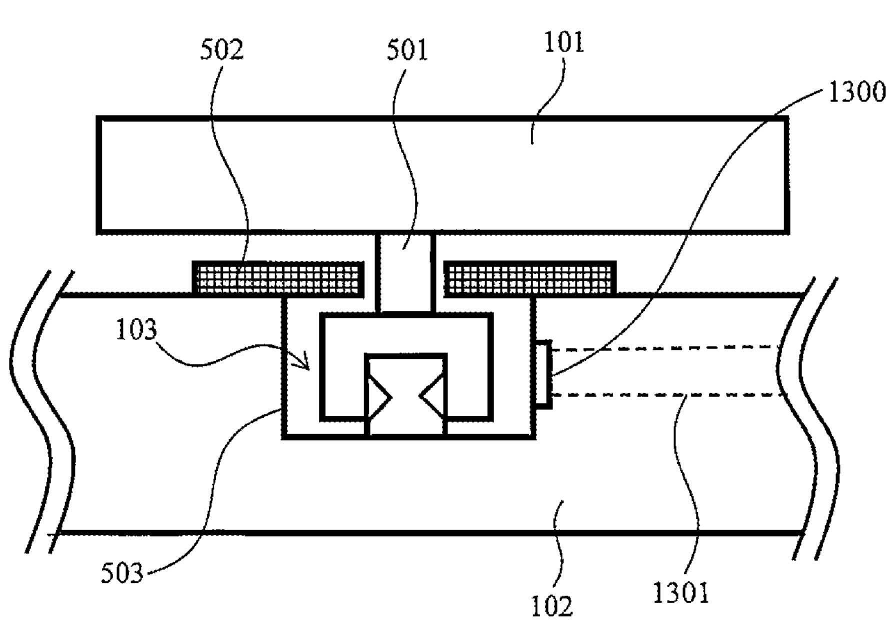
FIG. 13 is a diagram illustrating an exhaust port of a vacuum pump provided in a groove portion according to a fifth embodiment.
Figure 14:
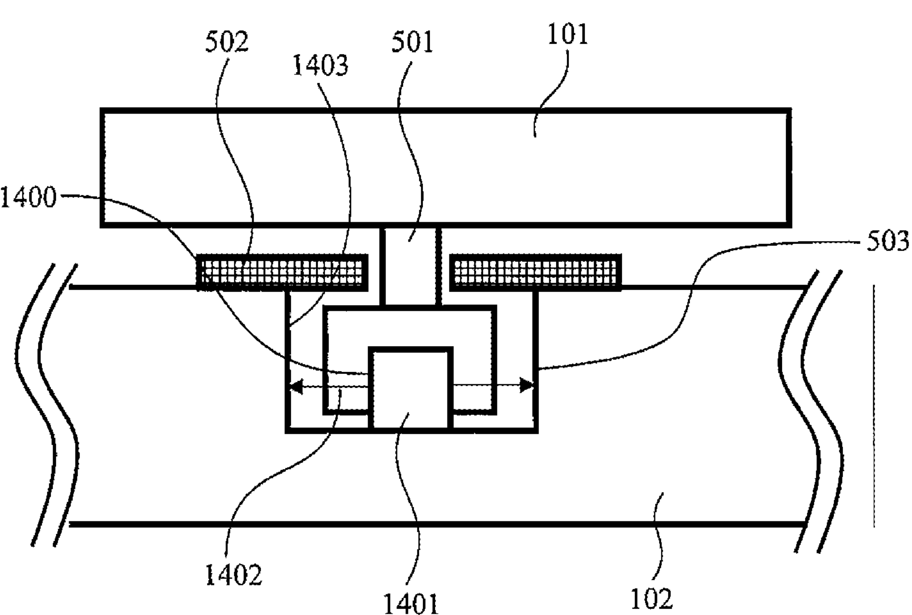
FIG. 14 is a diagram illustrating a configuration of a blocking portion according to a sixth embodiment.

Specifically, in the fifth embodiment, as illustrated in FIG. 13, the exhaust port 1300 connected to an exhaust path 1301 to the vacuum pump is provided in a side wall or a bottom surface of the groove portion 503. In addition, the exhaust port 1300 may be provided in a space formed by the blocking cover 1102 according to the second embodiment. The other configurations are the same as those of the first embodiment or the second embodiment.

Effect of Fifth Embodiment

In the fifth embodiment, the guide foreign matter that is scattered into a space formed by the blocking cover 502 and the groove portion 503 is immediately guided to the vacuum evacuation system such that the guide foreign matter can be suppressed from reaching the table 101. Since a movable exhaust pipe does not need to be used, an increase of contamination caused by the production of outgas from a resin pipe or deterioration in the performance of maintenance such as pipe replacement due to the lifetime of a movable pipe does not occur. The other effects are the same as the above-described embodiments.

Sixth Embodiment

The guide rail 201 according to the first embodiment has a shape where the center is constricted, and the guide surface 301 is a surface inclined with respect to a horizontal plane. A guide surface 1400 of a guide rail 1401 according to a sixth embodiment is a surface perpendicular to a horizontal plane. In the sixth embodiment, a blocking portion is provided to cover a normal direction 1402 of the guide surface 1400. Specifically, in the sixth embodiment, an inner wall portion 1403 of the groove portion 503 is the blocking portion that covers the normal direction 1402 of the guide surface 1400 of the guide rail 1401. The other configurations are the same as those of the first embodiment or the second embodiment.

Effect of Sixth Embodiment

In the sixth embodiment, even when the guide surface 1400 of the guide rail 1401 is a surface perpendicular to a horizontal plane, the guide foreign matter can be repelled in the inner wall portion 1403 of the groove portion 503. Irrespective of the inclination of the guide surface, normal directions of guide surfaces of various guide rails can be covered with the blocking portion. The other effects are the same as the above-described embodiments.

Seventh Embodiment

Figure 15:
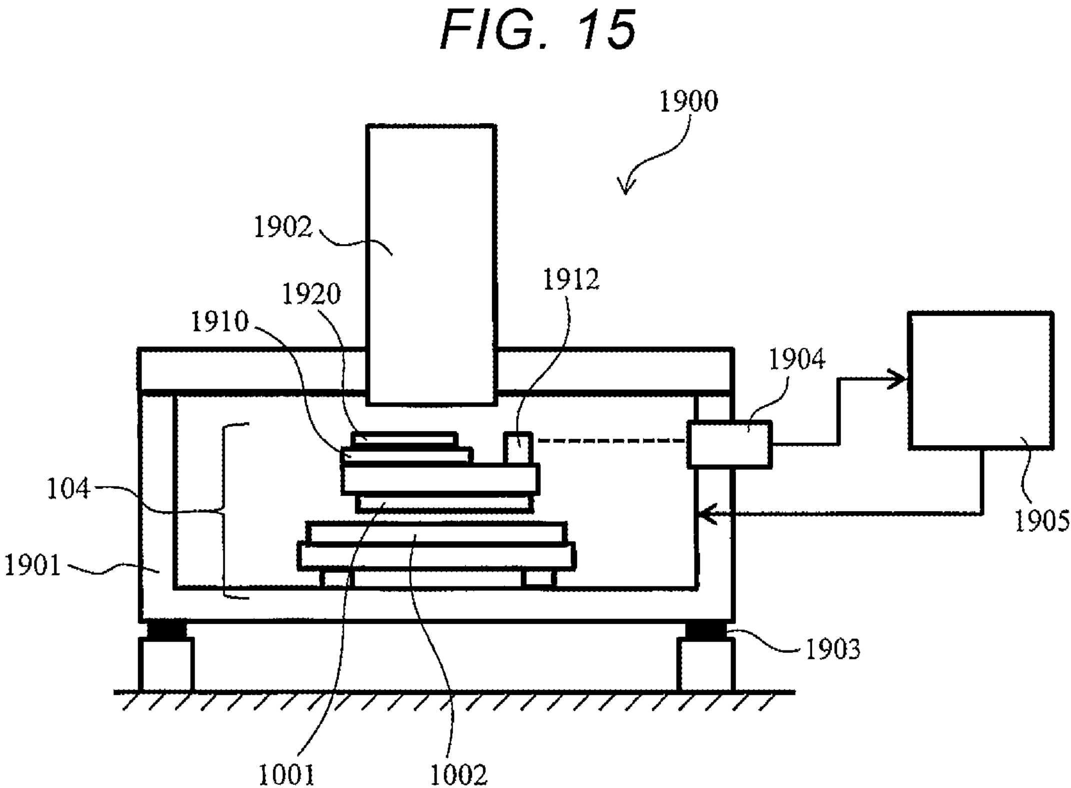
FIG. 15 is a diagram illustrating a charged particle beam apparatus according to a seventh embodiment.

FIG. 15 is a diagram illustrating a configuration of a charged particle beam apparatus according to a seventh embodiment. A charged particle beam apparatus 1900 illustrated in FIG. 15 includes the stage device according to any one of the first to sixth embodiments. The charged particle beam apparatus 1900 according to the seventh embodiment will be described with reference to FIG. 15. The charged particle beam apparatus 1900 illustrated in FIG. 15 is a semiconductor measurement apparatus on which the stage device including the blocking cover according to any one of the first to sixth embodiments is mounted. The semiconductor measurement apparatus 1900 according to the seventh embodiment is a CD-SEM as an application apparatus of a scanning electron microscope (SEM).

The semiconductor measurement apparatus 1900 includes the stage device 104, a vacuum chamber 1901 that accommodates the stage device 104, an electron optical system lens barrel 1902, a damping mount 1903, a laser interferometer 1904, and a controller 1905. The vacuum chamber 1901 accommodates the stage device 104 and is reduced in pressure by a vacuum pump (not illustrated) to enter a vacuum state having a lower pressure than the atmospheric pressure. The vacuum chamber 1901 is supported by the damping mount 1903.

In the semiconductor measurement apparatus 1900, a target 1920 such as a semiconductor wafer is positioned by the stage device 104, and the target 1920 is irradiated with an electron beam from the electron optical system lens barrel 1902. The semiconductor measurement apparatus 1900 images a pattern on the target 1920 and executes measurement of a line width of the pattern or evaluation of the shape accuracy. In the stage device 104, the position of a bar mirror 1912 is measured by the laser interferometer 1904, and the positioning of the target such as a semiconductor wafer held by a sample stage 1910 is controlled by the controller 1905.

Effect of Seventh Embodiment

The semiconductor measurement apparatus 1900 includes the stage device 104. As a result, the positioning accuracy of the target 1920 such as a semiconductor wafer can be improved, and the attachment of the guide foreign matter to the target 1920 can be suppressed. Accordingly, the cleanliness of the semiconductor measurement apparatus 1900 as the charged particle beam apparatus can be improved. In addition, the upper axis floating mechanism of the stage device 104 is a magnetic floating type. Therefore, the application of the stage device 104 to a semiconductor measurement apparatus as a vacuum apparatus is simple, and excellent effects such as a reduction of contamination caused by the production of outgas from a resin pipe or suppressing of heat generation can be exhibited. The charged particle beam apparatus according to the seventh embodiment is not limited to the semiconductor measurement apparatus. The other effects are the same as the above-described embodiments.

The present invention is not limited to the embodiments and includes various modification examples. The embodiments have been described in detail in order to easily describe the present invention, and the present invention is not necessarily to include all the configurations described above. In addition, a part of the configuration of one embodiment can be replaced with the configuration of another embodiment. Further, the configuration of one embodiment can be added to the configuration of another embodiment. In addition, addition, deletion, and replacement of another configuration can also be made for a part of the configuration each of the embodiments.

For example, the stage device according to any one of the first to sixth embodiments can be applied to a vacuum apparatus such as an X-ray inspection apparatus, an optical (UV light source) inspection apparatus, or an organic EL exposure apparatus.

In addition, in the first embodiment, one groove portion is formed for one linear guide 103. Instead, one groove portion that accommodates two or more linear guides 103 may be provided. Likewise, in the second embodiment, one blocking cover is prepared for one linear guide 103. Instead, one blocking cover that accommodates two or more linear guides 103 may be provided.

What is claimed is:

1. A stage device that is disposed in a vacuum environment and moves a target placed on the stage device, the stage device comprising:

a base including a groove portion recessed within a portion of the base;

a guide rail positioned within and fixed to the groove portion, the guide rail including an upper guide surface;

a carriage positioned within the groove portion and moves along the guide rail;

rolling elements that come into contact with the guide rail and the carriage and rotate along with the movement of the carriage; and a base table that is connected to a part of the carriage and moves along with the carriage, wherein a bottom portion of the groove portion is provided to completely cover a normal direction of the upper guide surface and blocks foreign matter scattered from the guide rail, the carriage, or the rolling elements.

2. The stage device according to claim 1, further comprising a blocking portion coupled to the base and provided to cover an upper opening portion of the groove portion, the blocking portion provided completely cover a normal direction of a lower guide surface of the guide rail and blocks foreign matter scattered from the guide rail, the carriage, or the rolling elements.

3. The stage device according to claim 2, wherein the blocking portion is formed to cover lateral sides and an upper side of the guide rail and the carriage.

4. The stage device according to claim 2, further comprising a spacer through which the base table is connected to a part of the carriage, wherein an opening portion through which the spacer passes is formed in the blocking portion.

5. The stage device according to claim 4, wherein an opening dimension of the opening portion is determined based on a height of a space formed by the groove portion, a width of the space, a height of the upper guide surface, and a width of the guide rail.

6. The stage device according to claim 2, wherein the blocking portion includes a first blocking member and a second blocking member that is a separate member from the first blocking member, the first blocking member is detachable in a state where the base table is moved to a first position, and the second blocking member is detachable in a state where the base table is moved to a second position.

7. The stage device according to claim 2, wherein the blocking portion is a magnetic body.

8. The stage device according to claim 1, further comprising a magnet that magnetizes the guide rail.

9. The stage device according to claim 2, wherein an exhaust port of a vacuum pump is provided in a space formed by the blocking portion.

10. The stage device according to claim 1, further comprising a floating table that floats from the base table.

11. The stage device according to claim 10, wherein the floating table is a magnetic floating table.

12. A charged particle beam apparatus comprising the stage device according to claim 1.

13. A vacuum apparatus comprising the stage device according to claim 1.

* * * * *